United States Patent
Okumura et al.

(10) Patent No.: US 6,547,638 B2
(45) Date of Patent: *Apr. 15, 2003

(54) METHOD AND APPARATUS FOR DRY-IN, DRY-OUT POLISHING AND WASHING OF A SEMICONDUCTOR DEVICE

(75) Inventors: Katsuya Okumura, Yokohama (JP); Riichirou Aoki, Tokyo (JP); Hiromi Yajima, Kanagawa-ken (JP); Seiji Ishikawa, Yokohama (JP); Manabu Tsujimura, Yokohama (JP)

(73) Assignees: Ebara Corporation, Tokyo (JP); Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/804,232

(22) Filed: Mar. 13, 2001

(65) Prior Publication Data

US 2001/0010997 A1 Aug. 2, 2001

Related U.S. Application Data

(63) Continuation of application No. 09/233,039, filed on Jan. 20, 1999, now Pat. No. 6,273,802, which is a division of application No. 08/767,060, filed on Dec. 16, 1996, now Pat. No. 5,885,138, which is a continuation-in-part of application No. 08/309,193, filed on Sep. 20, 1994, now Pat. No. 5,616,063, and a continuation-in-part of application No. 08/563,295, filed on Nov. 28, 1995, now Pat. No. 5,679,059, and a continuation-in-part of application No. 08/580,312, filed on Dec. 28, 1995, now Pat. No. 5,827,110.

(30) Foreign Application Priority Data

| Sep. 21, 1993 | (JP) | 5-259396 |
| Nov. 29, 1994 | (JP) | 6-319289 |
| Dec. 6, 1994 | (JP) | 6-330209 |
| Dec. 6, 1994 | (JP) | 6-330210 |
| Dec. 28, 1994 | (JP) | 6-339165 |
| Dec. 28, 1994 | (JP) | 6-339166 |
| Dec. 28, 1994 | (JP) | 6-339167 |

(51) Int. Cl.[7] .................................................. B24B 51/00
(52) U.S. Cl. .......................... 451/5; 451/41; 451/287; 451/288
(58) Field of Search ................................ 451/5, 41, 11, 451/54, 63, 65, 66, 42, 36, 259, 283, 285, 287, 288, 290, 292, 460, 291, 43

(56) References Cited

U.S. PATENT DOCUMENTS 4,020,600 A 5/1977 Day (List continued on next page.)

FOREIGN PATENT DOCUMENTS

FR 2505712 1/1985

(List continued on next page.)

OTHER PUBLICATIONS

"Planarization of Chemical–Mechanical Polishing for Multilevel Metal Integrated Circuits", William C. O'Mara, 1994, pp. 37, 62–64.

(List continued on next page.)

Primary Examiner—Joseph J. Hail, III
Assistant Examiner—Hadi Shakeri
(74) Attorney, Agent, or Firm—Wenderoth, Lind & Ponack, L.L.P.

(57) ABSTRACT

A polishing apparatus includes an arrangement of a plurality of units to deal with various operations and a robot having at least one arm. The plurality of units are disposed around the robot and include a loading unit for receiving thereon a, e.g. dry, workpiece to be polished, a polishing system including at least one polishing unit for polishing the workpiece, a washing system and a drying system at least including one washing unit for washing and drying the polished workpiece, and an unloading unit for receiving thereon a resultant clean and dry polished workpiece.

41 Claims, 11 Drawing Sheets

U.S. PATENT DOCUMENTS

| | | | |
|---|---|---|---|
| 4,050,954 A | | 9/1977 | Basi |
| 4,141,180 A | | 2/1979 | Gill, Jr. et al. |
| 4,193,226 A | | 3/1980 | Gill, Jr. et al. |
| 4,313,266 A | | 2/1982 | Tam |
| 4,653,231 A | | 3/1987 | Cronkhite et al. |
| 4,680,893 A | | 7/1987 | Cronkhite et al. |
| 4,838,150 A | | 6/1989 | Suzuki et al. |
| 4,851,101 A | | 7/1989 | Hutchinson |
| 4,905,425 A | | 3/1990 | Sekigawa et al. |
| 4,956,944 A | | 9/1990 | Ando et al. |
| 4,984,392 A | | 1/1991 | Seikgawa et al. |
| 5,094,037 A | * | 3/1992 | Hakomori et al. ............ 451/43 |
| 5,096,477 A | | 3/1992 | Shinoda et al. |
| 5,140,774 A | * | 8/1992 | Onodera .................... 451/269 |
| 5,213,118 A | | 5/1993 | Kamikawa |
| 5,254,205 A | * | 10/1993 | Tsutsumi et al. ........... 451/460 |
| 5,299,584 A | | 4/1994 | Miyazaki et al. |
| 5,329,732 A | | 7/1994 | Karlsrud et al. |
| 5,333,413 A | | 8/1994 | Hashimoto |
| 5,361,545 A | | 11/1994 | Nakamura |
| 5,421,768 A | | 6/1995 | Fujiwara et al. |
| 5,425,793 A | | 6/1995 | Mori et al. |
| 5,431,600 A | | 7/1995 | Murata et al. |
| 5,456,627 A | | 10/1995 | Jackson et al. |
| 5,498,294 A | | 3/1996 | Matsushita et al. |
| 5,518,542 A | | 5/1996 | Matsukawa et al. |
| 5,582,534 A | | 12/1996 | Shendon et al. |
| 5,616,063 A | | 4/1997 | Okumura et al. |
| 5,618,227 A | | 4/1997 | Tsutsumi et al. |
| 5,655,954 A | * | 8/1997 | Oishi et al. ................... 134/62 |
| 5,679,060 A | * | 10/1997 | Leonard et al. ............. 451/285 |
| 5,738,574 A | | 4/1998 | Tolles et al. |
| 5,779,520 A | * | 7/1998 | Hayakawa .................. 451/286 |
| 5,885,138 A | | 3/1999 | Okumura et al. |
| 6,110,011 A | * | 8/2000 | Somekh et al. ............... 451/28 |
| 6,213,853 B1 | * | 4/2001 | Gonzalez-Martin et al. 451/287 |

FOREIGN PATENT DOCUMENTS

| | | |
|---|---|---|
| JP | 57-48472 | 3/1982 |
| JP | 59-19671 | 2/1984 |
| JP | 60-8189 | 3/1985 |
| JP | 61-152357 | 7/1986 |
| JP | 63-207559 | 8/1988 |
| JP | 4-334025 | 11/1992 |
| JP | 5-152262 | 6/1993 |
| JP | 6-99348 | 4/1994 |
| JP | 6-252110 | 9/1994 |

OTHER PUBLICATIONS

Katsuya Okumura et al., U.S. Patent Application Ser. No. 09/804,234, filed Mar. 13, 2001 (specification, claims, drawings and declaration).

Katsuya Okumura et al., U.S. Patent Application Ser. No. 09/804,233, filed Mar. 13, 2001 (specification, claims, drawings and declaration).

Katsuya Okumura et al., U.S. Patent Application Ser. No. 09/804,231, filed Mar. 13, 2001 (specification, claims, drawings and declaration).

Patent Abstracts of Japan, vol. 12, No. 485(mm–777), Dec. 19, 1988.

Patent Abstracts of Japan, vol. 8, No. 80 (M–289), Apr. 12, 1994.

* cited by examiner

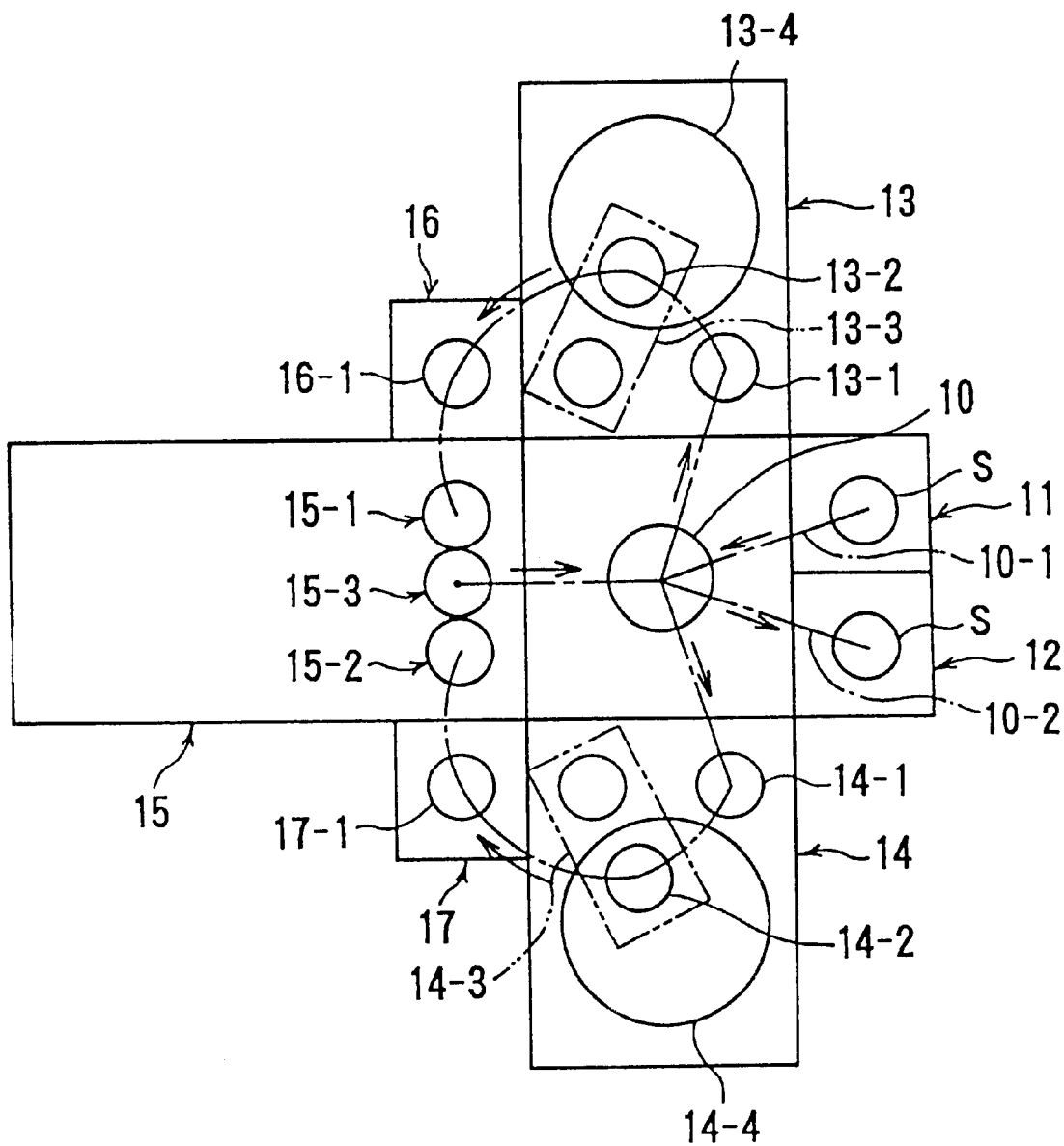
F I G. 1

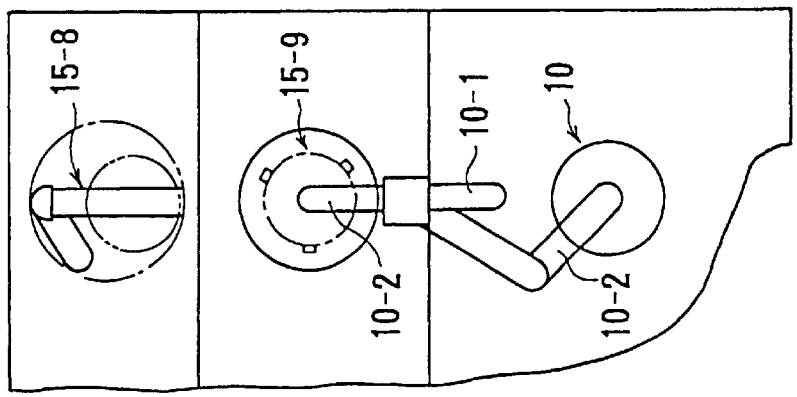
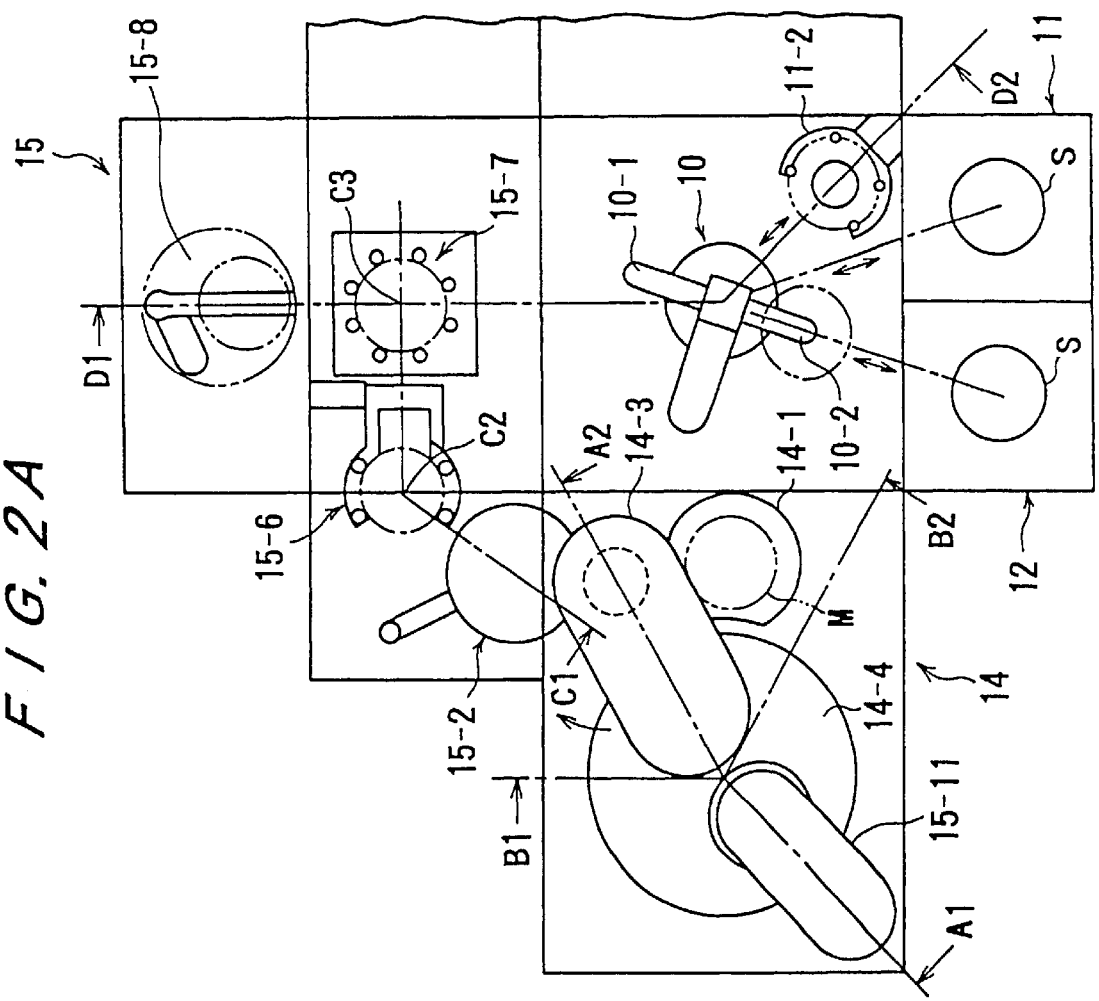

F I G. 10
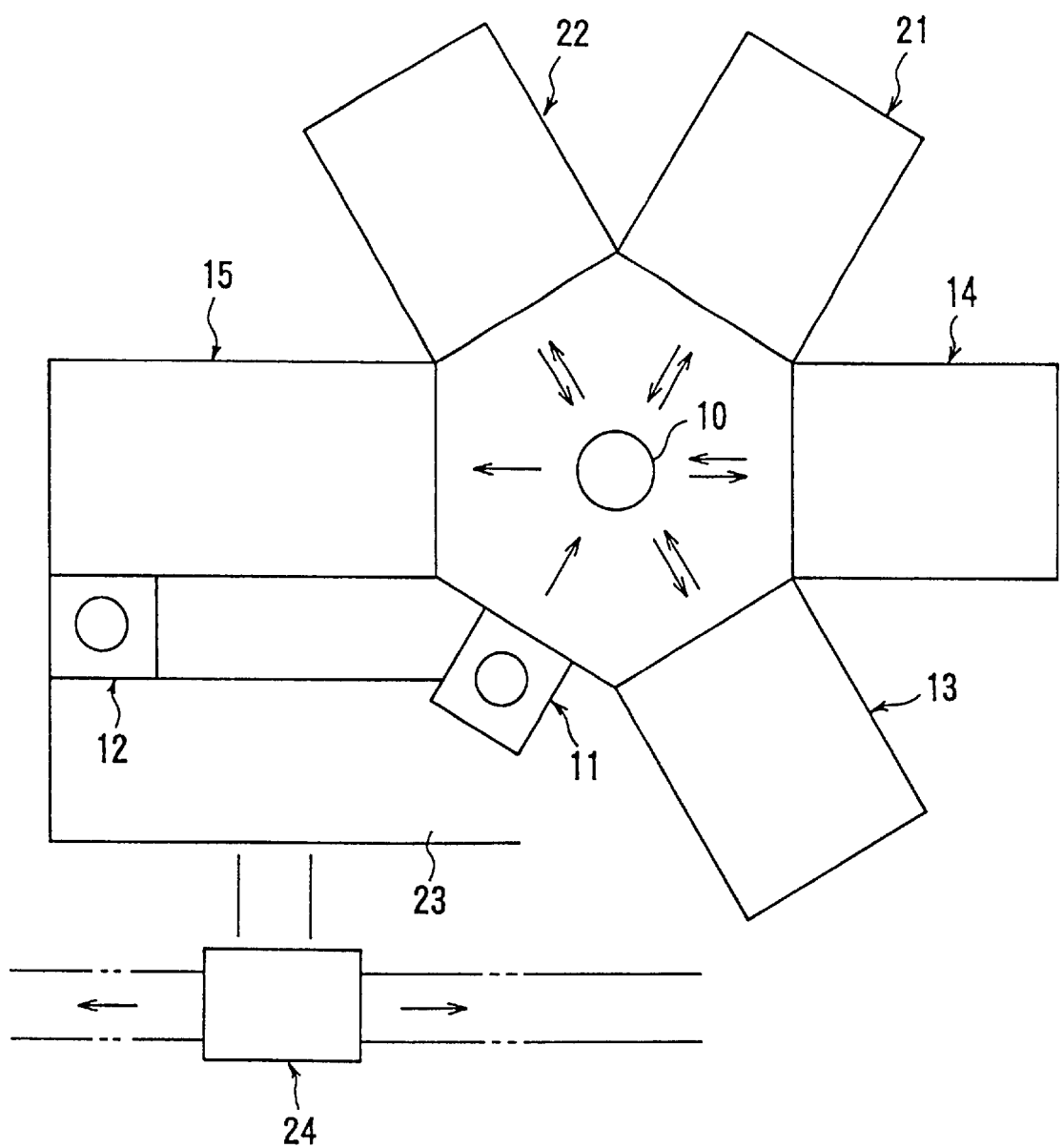

METHOD AND APPARATUS FOR DRY-IN, DRY-OUT POLISHING AND WASHING OF A SEMICONDUCTOR DEVICE

This is a continuation of U.S. patent application Ser. No. 09/233,039, filed Jan. 20, 1999, now U.S. Pat. No. 6,273,802 which is a division of application Ser. No. 08/767,060, filed Dec. 16, 1996, now U.S. Pat. No. 5,885,138, which is a Continuation-In-Part of application Ser. No. 08/309,193, filed Sep. 20, 1994, now U.S. Pat. No. 5,616,063, of application Ser. No. 08/563,295, filed Nov. 28, 1995, now U.S. Pat. No. 5,679,059, and of application Ser. No. 08/580,312, filed Dec. 28, 1995, now U.S. Pat. No. 5,827,110.

BACKGROUND OF THE INVENTION

1. Field of the Invention

The present invention relates to a polishing method and apparatus, and more particularly to such a method and apparatus for polishing a workpiece such as a semiconductor wafer. Further particularly, the present invention relates to such a method and apparatus wherein a workpiece to be polished and washed, particularly a dry workpiece, is loaded into the apparatus, is polished and then washed and dried therein, and wherein the resultant clean and dry polished workpiece is transferred from the apparatus. When a dry workpiece to be polished is loaded into the apparatus and a clean and dry polished workpiece is transferred from the apparatus, the method is referred to hereinafter as a "dry-in, dry-out" method. Still further particularly, the present invention relates to such a "dry-in, dry-out" method and apparatus including a plurality of operating units disposed in an array or cluster around at least one center robot having at least one robot arm, and having a transfer structure including separate and discrete transfer mechanisms including at least one first transfer mechanism for transferring a dry workpiece into the apparatus and for transferring the clean and dry polished workpiece from the apparatus, and at least one second transfer mechanism for transferring the workpiece between polishing and washing units of the apparatus.

2. Description of Related Art

Recent rapid progress in semiconductor device integration demands smaller and smaller wiring patterns or interconnections and also narrower spaces between interconnections which connect active areas. One of the processes available for forming such interconnections is photolithography. Although a photolithographic process can form interconnections that are at most 0.5 μm wide, such process requires that surfaces on which pattern images are to be focused by a stepper be as flat as possible because the depth of focus of the optical system is relatively small.

It is therefore necessary to make the surfaces of semiconductor wafers flat to enable use of photolithography. One customary way of flattening the surfaces of semiconductor wafers is to polish them with a polishing apparatus.

Conventionally, such a polishing apparatus has a single function of polishing a semiconductor wafer. Therefore, in the case of washing a semiconductor wafer after polishing, the semiconductor wafer must be transferred or transported from the polishing apparatus to a washing apparatus. Further, in the case of polishing a semiconductor wafer again under different conditions after a first polishing operation, the semiconductor wafer must be transferred or transported from one polishing apparatus to another polishing apparatus. In such cases, the semiconductor wafers are manually transferred or transported by a movable container in which they are immersed in water to keep them from drying during transportation. However, since various apparatuses including a polishing apparatus and a washing apparatus are independently installed and the semiconductor wafers are transferred or transported by the movable container containing water therein, it is difficult to install the polishing apparatus, the washing apparatus and the like in a clean room of a semiconductor manufacturing plant and to automate completely various processes including a polishing process and a washing process.

In order to solve the above problems, there has been proposed an apparatus which has a polishing unit and a washing unit provided in a common housing. Further, if necessary, a plurality of polishing units can be provided in a common housing. In a polishing apparatus which has a polishing unit and a washing unit, or a plurality of polishing units in a common housing, it is conceivable to construct a cluster type of polishing, apparatus which integrates a plurality of units including a polishing unit and a washing unit, as employed in a semiconductor manufacturing process such as etching or chemical vapor deposition (CVD).

However, in the case of constructing a cluster type of polishing apparatus which integrates a plurality of units and incorporates a universal transfer robot at a central position of the units, it is necessary to handle both a dirty and wet semiconductor wafer soiled with abrasive slurry or particles generated by the polishing operation and a clean and dry semiconductor wafer which is placed on a loading unit or an unloading unit. Therefore, a conventional robot incorporated in a cluster type of a semiconductor manufacturing processing apparatus cannot be used in a cluster type of polishing apparatus because such robot is not capable of handling separately both a clean semiconductor wafer and a dirty semiconductor wafer. If such conventional robot is incorporated into the polishing apparatus, a washing process and a drying process of the robot or a robot arm additionally are required, thus lowering throughput efficiency of the apparatus. Further, when such robot or the robot arm is left for a long time as it is, abrasive material or particles generated by the polishing operation adhere to the robot or the robot arm, resulting in contamination of subsequent semiconductor wafers or respective units of the polishing apparatus.

SUMMARY OF THE INVENTION

Therefore, it is an object of the present invention to provide an improved polishing method and apparatus wherein it is possible to achieve polishing of a workpiece and then to achieve washing and drying of the workpiece.

It is a further object of the present invention to provide such a method and apparatus wherein workpieces to be polished that are introduced to the apparatus are dry and wherein polished and cleaned workpieces that are discharged from the apparatus also are dry, wherein the method and apparatus operate according to a dry-in, dry-out principle.

It is a yet further object of the present invention to provide such a method and apparatus wherein it is possible to overcome the above discussed and other prior art disadvantages and to provide a much greater degree of manufacturing flexibility than has been possible in the prior art.

It is an even still further object of the present invention to provide such a polishing method and apparatus employing a cluster type arrangement of a plurality of units that perform various operations, as well as a transfer structure including exclusive means for handling a clean semiconductor wafer and exclusive means for handling a dirty semiconductor wafer. Thus, a transfer mechanism or mechanisms that handle a dry semiconductor wafer to be loaded into the apparatus and that handle a clean and dry semiconductor wafer that has been polished and then washed and dried and that is discharged from the apparatus are exclusive, discrete and separate from a transfer mechanism or mechanisms that transfer semiconductor wafers among polishing and washing systems of the apparatus. Thus, dry semiconductor wafers are loaded into the apparatus, and dry semiconductor wafers that have been polished and washed are transferred from the apparatus.

In accordance with one aspect of the present invention, there is provided a method and apparatus wherein a workpiece to be polished is transferred from a loading unit to a polishing system, whereat the workpiece is polished to form a polished workpiece. The polished workpiece is transferred from the polishing unit to a washing unit defining washing and drying systems. The workpiece is washed and then dried at the washing unit to form a clean and dry polished workpiece. The thus clean and dry polished workpiece then is transferred from the washing unit to an unloading unit. In accordance with a further feature of the present invention, the workpiece to be polished is transferred in a dry condition from the loading unit to the polishing unit.

According to another aspect of the present invention, there is provided a polishing method and apparatus for polishing a surface of a workpiece and washing the workpiece which has been polished. A universal transfer robot has at least one arm for transferring the workpiece. A plurality of units are disposed around the universal transfer robot and include a loading unit for receiving thereon the dry workpiece to be polished, a polishing system including at least one polishing unit for polishing the workpiece which is transferred from the loading unit, a washing system and a drying system defined by at least one washing unit for washing and drying the workpiece which has been polished and an unloading unit for receiving thereon the resultant washed and dried polished workpiece. A transfer structure includes an exclusive transfer mechanism that transfers a clean workpiece and another exclusive transfer mechanism that transfers a dirty workpiece. The loading unit, the unloading unit, the polishing unit and the washing unit are disposed around the universal transfer robot. A workpiece, i.e. a dry workpiece, is picked up from the loading unit by the universal transfer robot, transferred to the polishing unit, and polished by the polishing unit. After the polishing operation, the thus dirty workpiece is transferred from the polishing unit to the washing unit by another exclusive transfer mechanism and is washed and dried by the washing unit. After such washing and drying operations, the resultant clean and dry polished workpiece is transferred from the washing unit to the unloading unit by the universal transfer robot.

According to a further aspect of the present invention, the universal transfer robot has an arm for exclusively handling a clean workpiece and an arm for exclusively handling a dirty workpiece. The loading unit, the unloading unit, the polishing unit and the washing unit are disposed around the universal transfer robot. A workpiece, e.g. a dry workpiece, is picked up from the loading unit by the arm for exclusively handling a clean workpiece of the universal transfer robot, transferred to the polishing unit, and polished by the polishing unit. After such polishing operation, the thus dirty workpiece is transferred from the polishing unit to the washing unit by the arm for exclusively handling a dirty workpiece of the universal transfer robot, and is washed and dried by the washing unit. After such washing and drying operations, the resultant clean and dry polished workpiece is transferred from the washing unit to the unloading unit by the arm for exclusively handling a clean workpiece of the universal transfer robot.

According to a still further aspect of the present invention, the transfer structure includes two universal transfer robots each having at least one arm for transferring the workpiece, and the plurality of units are disposed around the two universal transfer robots. One of the universal transfer robots transfers a clean workpiece and the other of the universal transfer robots transfers a dirty workpiece. The loading unit, the unloading unit, the polishing unit and the washing unit are disposed around the two universal transfer robots. A workpiece, e.g. a dry workpiece, is picked up from the loading unit by the universal transfer robot for exclusively handling a clean workpiece, transferred to the polishing unit, and polished by the polishing unit. After such polishing operation, the thus dirty workpiece is transferred from the polishing unit to the washing unit by the universal transfer robot for exclusively handling a dirty workpiece, and is washed and dried by the washing unit. After such washing and drying operations, the resultant clean and dry polished clean workpiece is transferred from the washing unit to the unloading unit by the universal transfer robot for exclusively handling a clean workpiece.

BRIEF DESCRIPTION OF THE DRAWINGS

FIG. 1 is a schematic plan view of an embodiment of a polishing apparatus according to the present invention;

FIG. 2A is a schematic plan view of part of the polishing apparatus according to the present invention, FIG. 2B is a schematic plan view of a washing unit in the polishing apparatus according to the present invention;

FIG. 10 is a schematic plan view of a fifth embodiment of a polishing apparatus according to the present invention.

DETAILED DESCRIPTION OF THE PREFERRED EMBODIMENTS

Figure 3:
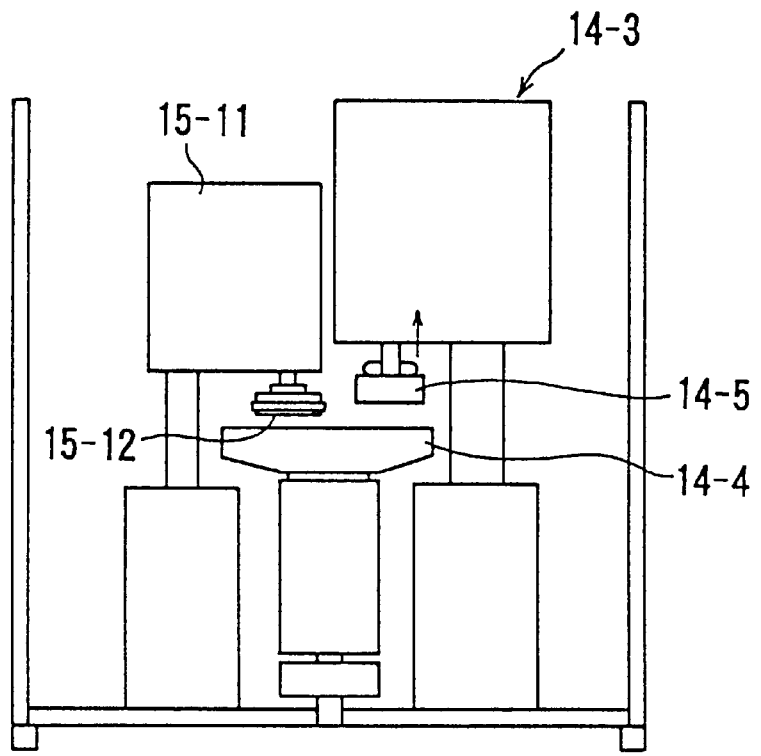
FIG. 3 is a cross-sectional view taken along line A1-A2 of FIG. 2A.
Figure 4:
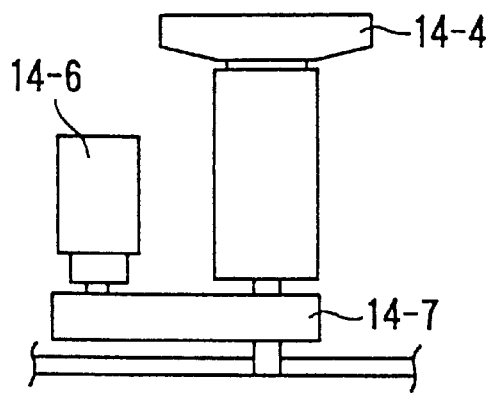
FIG. 4 is a cross-sectional view taken along line B1-B2 of FIG. 2A.

Each of the embodiments will be described with reference to polishing a workpiece in the form of a semiconductor wafer.

A first embodiment of a polishing apparatus according to the present invention will be described below with reference to FIG. 1. As shown in FIG. 1, the polishing apparatus has a center robot 10 having arms 10-1 and 10-2 at a central part thereof The center robot 10 constitutes a universal transfer robot. Around the center robot 10 and in the area that can be accessed by the arm 10-1, there are provided a loading unit 11 on which a semiconductor wafer S to be polished, e.g. a dry semiconductor wafer, is placed, an unloading unit 12 on which a clean and dry semiconductor wafer S which has been polished and then cleaned and dried is placed, a polishing system including polishing units 13 and 14 each for polishing the semiconductor wafer S, and a washing system and drying system including washing unit 15 for washing and drying the polished semiconductor wafer S.

The polishing unit 13 has a polishing head supporting arm 13-3, a turntable 13-4 and a top ring rotatably provided on the polishing head supporting arm 13-3. The polishing unit 14 has a polishing head supporting arm 14-3, a turntable 14-4 and a top ring rotatably provided on the polishing head supporting arm 14-3. An abrasive cloth is attached to each of respective upper surfaces of the turntables 13-4 and 14-4. Each of the polishing head supporting arms 13-3 and 14-3 constitutes an exclusive transferring device for transferring the semiconductor wafer S from a loading position 13-1, 14-1 of the polishing unit to the turntable 13-4, 14-4. Further, each of the polishing head supporting arms 13-3 and 14-3 constitutes an exclusive transferring device for transferring the polished semiconductor wafer S from the polishing unit 13, 14 to the washing unit 15. The polishing apparatus has a table 16 for a dressing tool 16-1 for dressing the abrasive cloth on the turntable 13-4 and a table 17 for a dressing tool 17-1 for dressing the abrasive cloth on the turntable 14-4.

In the polishing apparatus, the semiconductor wafer S to be polished is picked up under vacuum by the arm 10-1 of the center robot 10, is inverted to dispose a surface thereof to be polished downwardly, and is transferred to the loading position 13-1 of the polishing unit 13. The top ring of the polishing head supporting arm 13-3 holds the semiconductor wafer S and presses the semiconductor wafer S against the abrasive cloth attached to the upper surface of the turntable 13-4. At this time, the turntable 13-4 is rotated, and the top ring is rotated about its own axis and swung on the turntable 13-4 by the polishing head supporting arm 13-3, whereby the semiconductor wafer S is polished.

After such polishing operation, the polished semiconductor wafer S is transferred to a loading position 15-1 of the washing unit 15 by the polishing head supporting arm 13-3. The polishing head supporting arm 13-3 which releases the semiconductor wafer S at the loading position 15-1 chucks dressing tool 16-1 on the table 16 and presses the dressing tool 16-1 against the abrasive cloth on the turntable 13-4, thereby dressing such abrasive cloth. This dressing operation may be performed by an exclusive dressing mechanism.

The semiconductor wafer S which has been transferred to the loading position 14-1 of the polishing unit 14 by the arm 10-1 of the center robot 10 also is held by the top ring of the polishing head supporting arm 14-3 and pressed against the abrasive cloth attached to the upper surface of the turntable 14-4. After such polishing operation, the polished semiconductor wafer S is transferred to a loading position 15-2 of the washing unit 15. Further, the polishing head supporting arm 14-3 which releases the semiconductor wafer S chucks dressing tool 17-1 on the table 17 and presses the dressing tool 17-1 against the abrasive cloth on the turntable 14-4, thereby dressing such abrasive cloth.

The polished semiconductor wafer S transferred to the loading position 15-1 or the loading position 15-2 is washed and dried in the washing unit 15, and then is transferred to an unloading position 15-3. The polished semiconductor wafer S thus is cleaned and dried and is transferred from the unloading position 15-3 to the unloading unit 12 by the arm 10-2 of the center robot 10. All of the above described operations are performed entirely automatically.

Next, the polishing unit 14 and the washing unit 15 will be described in detail with reference to FIGS. 2A through 6A that further illustrate the embodiment of the present invention shown in FIG. 1. However, FIGS. 2A–6A do not illustrate a dressing tool and a table therefor, but rather illustrate an exclusive dressing mechanism 15-11.

Figure 5:
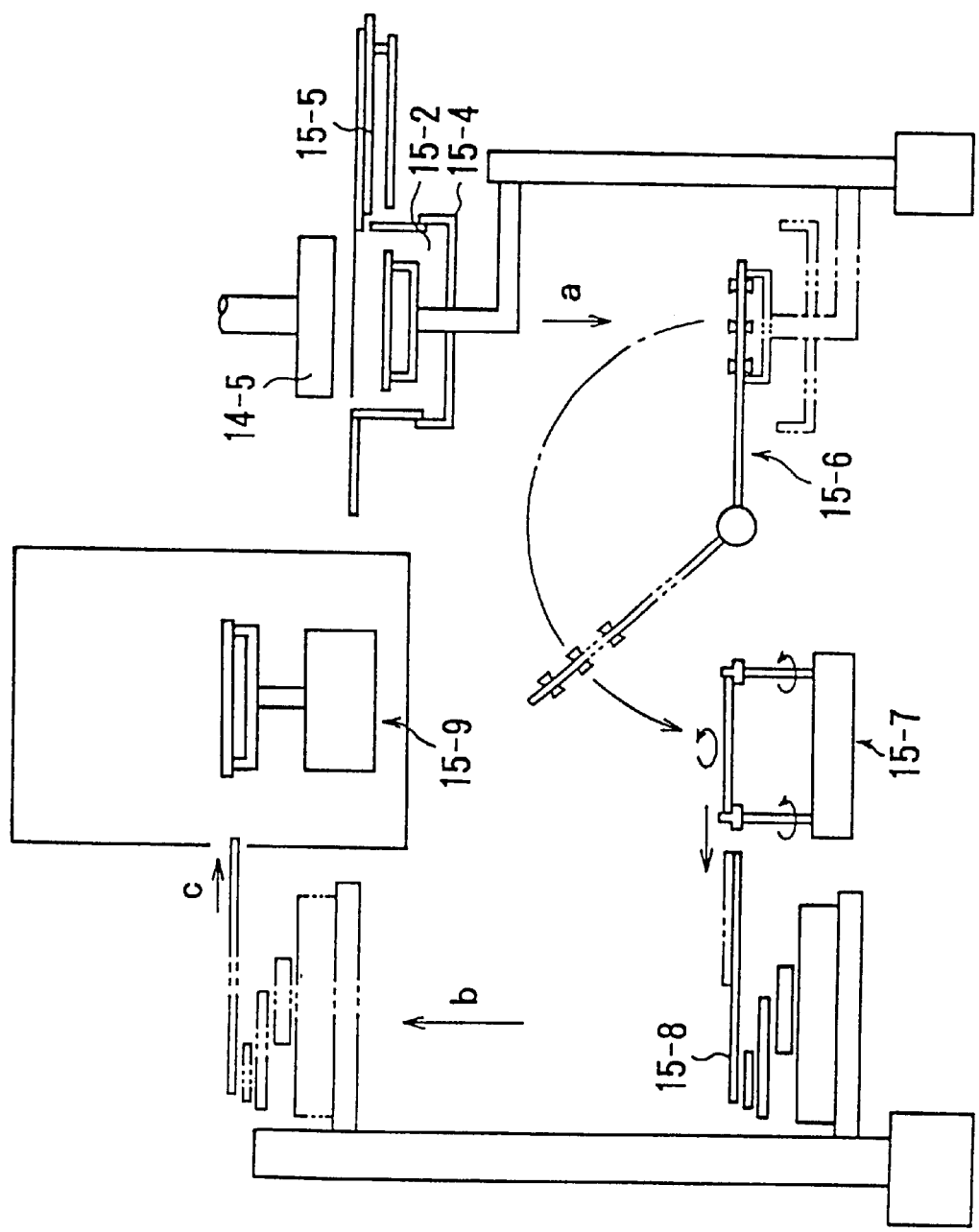
FIG. 5 is a cross-sectional view taken along line D1-C3-C2-C1 of FIG. 2A.

As shown in FIG. 2A, the semiconductor wafer S placed on the loading unit 11 is picked up by the arm 10-1 of the center robot 10, inverted to direct its surface to be polished downwardly by a reversing mechanism 11-2, and transferred to the loading position 14-1 of the polishing unit 14. As shown in FIG. 3, the semiconductor wafer S is held under vacuum by the top ring 14-5 provided at the forward end of the polishing head supporting arm 14-3 and moved above the turntable 14-4. Thereafter, the top ring 14-5 is lowered, and the semiconductor wafer S held by the top ring 14-5 is pressed against the abrasive cloth on the turntable 14-4, whereby the semiconductor wafer S is polished. The turntable 14-4 is rotated by a motor 14-6 through a timing belt 14-7 (see FIG. 4). As shown in FIG. 5, after such polishing operation, the arm 14-3 and top ring 14-5 put the semiconductor wafer S into a washing receptacle 15-4 which is standing by at an opening of the loading position 15-2 of the washing unit 15, and top ring 14-5 is washed by cleaning solvent. During such washing operation, the opening of the loading position 15-2 is closed by a shutter 15-5. The top ring 14-5 which releases the semiconductor wafer S is washed at the loading position by a washing mechanism of the washing unit 15.

After such washing operation, the semiconductor wafer S is moved in direction a (FIG. 5) and transferred to a reversing or inverting mechanism 15-6 by which the semiconductor wafer S is inverted to dispose its surface which has been polished upwardly and supplied to a primary washing station 15-7. A primary washing operation is carried out using cleaning solvent such as pure water at the primary washing station 15-7. Thereafter, the semiconductor wafer S is picked up by a transfer robot 15-8 in the washing unit 15, moved in directions of arrows b and c and fed to a secondary washing station 15-9. A secondary washing operation is carried out using cleaning solvent such as pure water at the secondary washing station 15-9.

Figure 6:
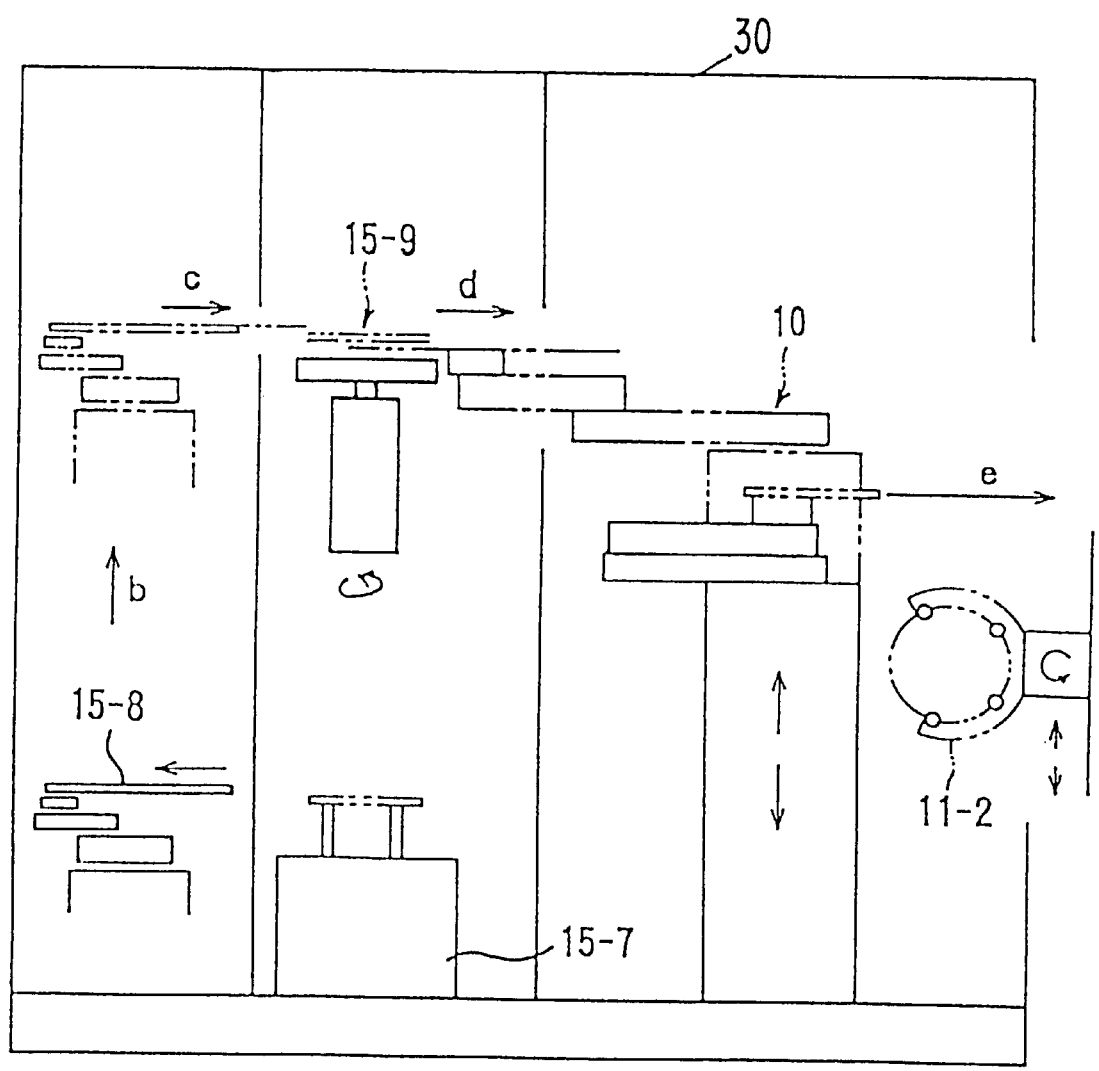
FIG. 6 is a cross-sectional view taken along line D1-D2 of FIG. 2A.

After the secondary washing operation, the semiconductor wafer S is dried. Thus, the workpiece may be dried in the manner shown schematically in FIG. 6, wherein after the secondary washing operation at station 15-9, the wafer is dried by a drying, system, in this embodiment spin-dried by spinning, a wafer holding station at high speed, for example by a motor. This spinning is indicated schematically by the circular arrow in FIG. 6. The thus washed and dried polished wafer then is picked up by the arm 10-2 of the center robot 10, moved in directions of arrows d and e as shown in FIG. 6, and transferred to the unloading unit 12. As shown in FIG. 2A, dressing mechanism 15-11 dresses the abrasive cloth on the turntable 14-4. The dressing mechanism 15-11 has a rotating brush 15-12 as shown in FIG. 3.

Figure 6A:
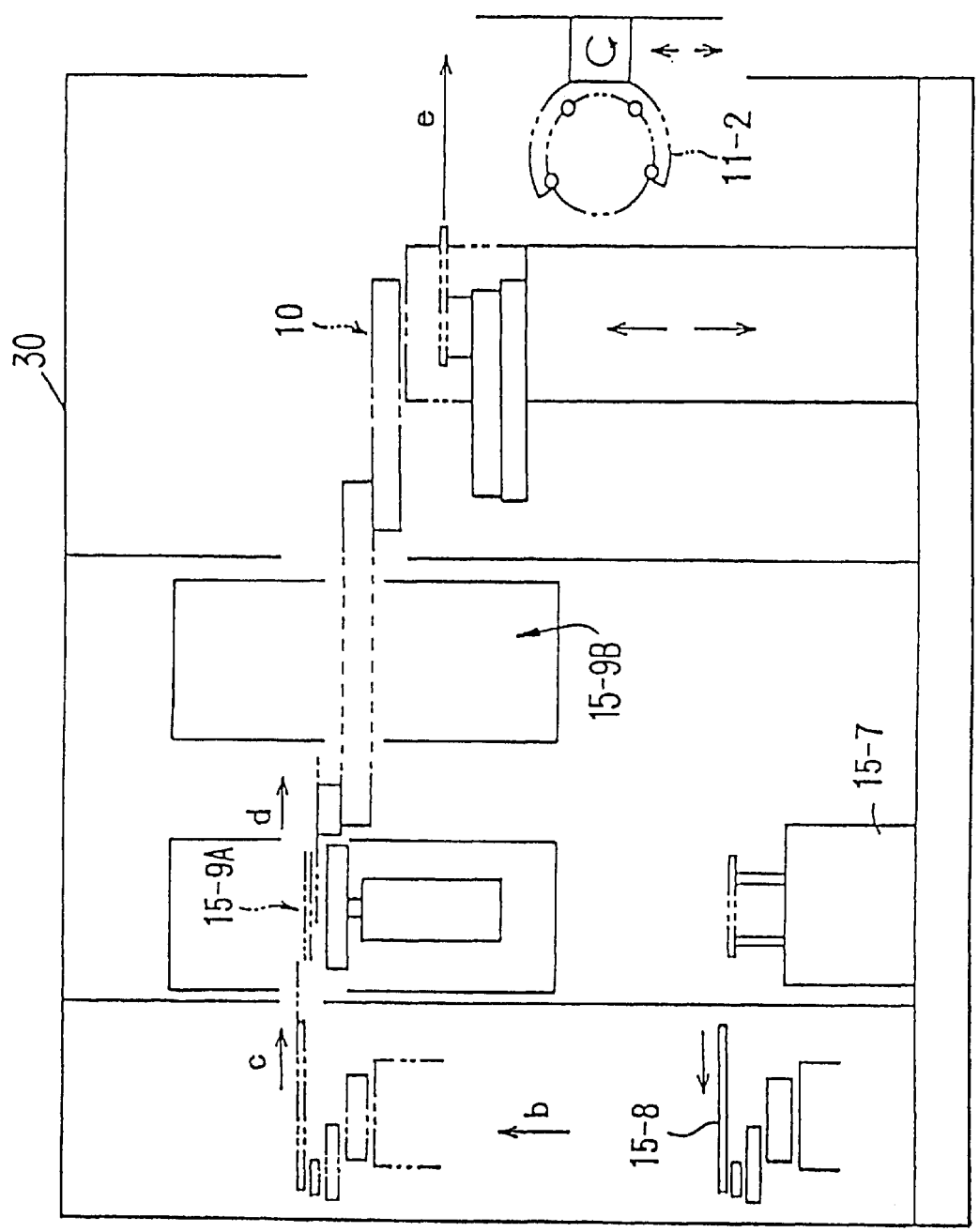
FIG. 6A is a view similar to FIG. 6, but showing a modified washing unit.

An alternative drying arrangement is shown schematically in FIG. 6A. Thus, the washing and drying system include a washing unit having a separate secondary washing station 15-9A and a separate drying station 15-9B. After secondary washing in station 15-9A, the thus cleaned wafer is transferred, for example by arm 10-2 of robot 10, to drying station 15-9B whereat the wafer is dried. The thus cleaned and dried polished wafer then is transferred by arm 10-2 of robot 10 and moved further in direction e to unloading unit 12.

The drying arrangements shown schematically in FIGS. 6 and 6A may be in accordance with the structures shown in Ser. No. 08/563,295 and Ser. No. 08/580,312, the disclosures of which hereby are incorporated herein by reference.

In accordance with the present invention, the entire apparatus is compact in size and therefore may be positioned in enclosing structure, e.g. a housing unit 30, shown schematically in FIGS. 6 and 6A. When housing unit 30 is provided with a necessary exhaust duct system, the polishing apparatus can be installed in a clean room without lowering the cleanliness thereof, without requiring a large amount of space in the clean room, and at any suitable and flexibly movable position within the clean room.

According to the first embodiment, the polishing apparatus comprises a center robot 10 having arms 10-1 and 10-2 and constituting a universal transfer robot for transferring the semiconductor wafer S to the respective units, a plurality of units disposed around the center robot 10 and including a loading unit 11 for receiving thereon the semiconductor wafer S to be polished, an unloading unit 12 for receiving thereon the clean and dry semiconductor wafer S which has been polished, polishing units 13 and 14 each for polishing the semiconductor wafer S, and a washing unit for washing and drying the polished semiconductor wafer S. The polishing apparatus further comprises a polishing head supporting arm 13-3 having a top ring for transferring the semiconductor wafer S between two adjacent units and a polishing head supporting arm 14-3 having a top ring for transferring the semiconductor wafer S between two adjacent units. A transfer structure includes center robot 10 that handles clean and dry semiconductor wafers S, and the polishing head supporting arms 13-3 and 14-3 that handle dirty and wet semiconductor wafers S. Particularly, center robot 10 handles a, e.g. dry, semiconductor wafer S from the loading unit 11 to the loading position of the particular polishing unit, and center robot 10 also handles a clean and dry polished semiconductor wafer S from the unloading position 15-3 of the washing unit 15 to the unloading unit 12. On the other hand, the polishing head supporting arms 13-3 and 14-3 handle dirty and wet semiconductor wafers S from the respective polishing units to the washing unit.

The center robot 10 has the arm 10-1 which is exclusively used for loading the semiconductor wafer to be polished and the arm 10-2 which is exclusively used for unloading the clean and dry semiconductor wafer which has been polished. This arrangement is preferable in a case where the degree of cleanliness of the semiconductor wafer S transferred from the loading unit 11 is different from that of the semiconductor wafer S transferred to the unloading unit 12.

Figure 7:
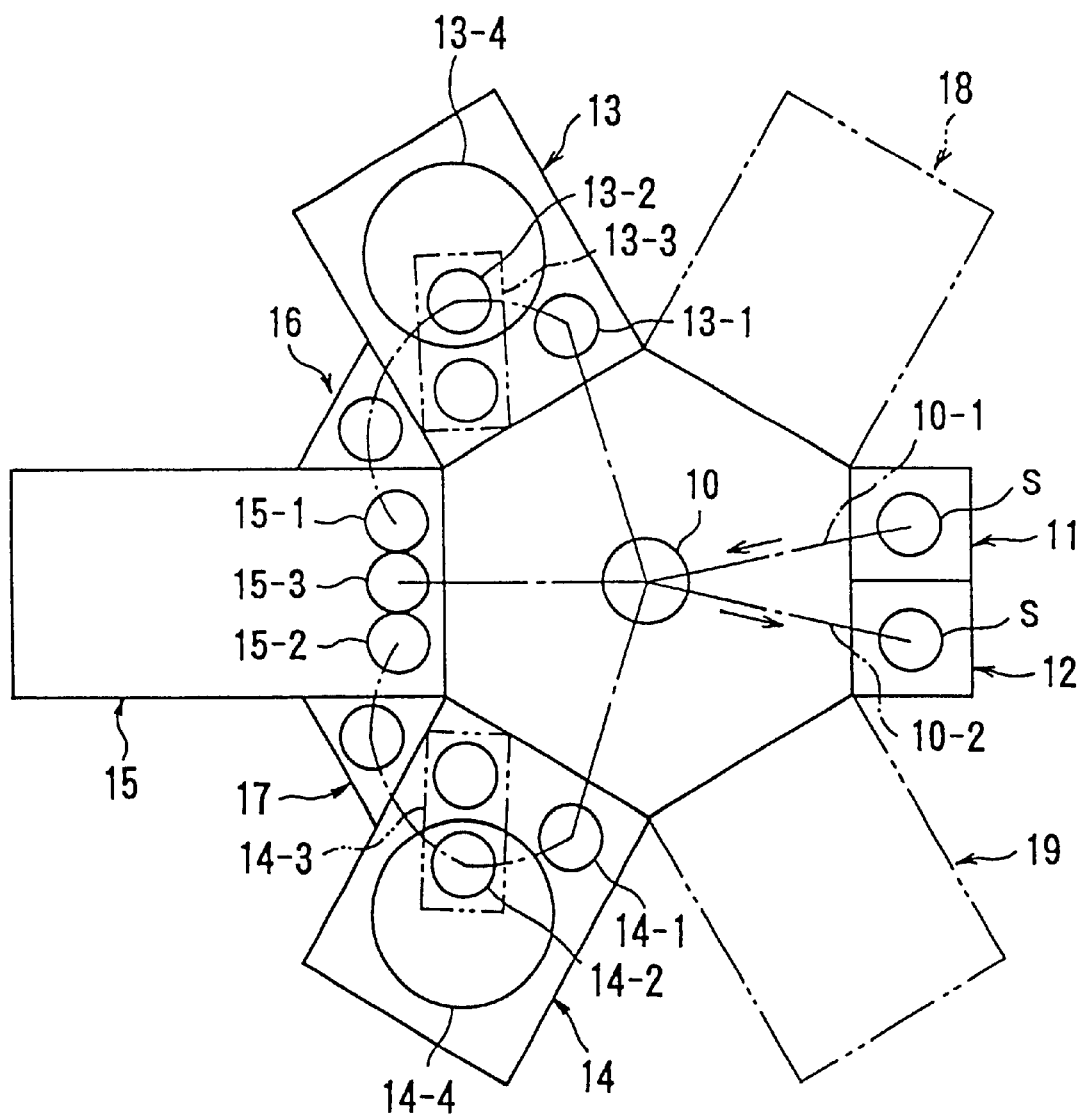
FIG. 7 is a schematic plan view of a second embodiment of a polishing apparatus according to the present invention.

Next, a further embodiment of the polishing apparatus according to the present invention will be described below with reference to FIG. 7. The parts shown in FIG. 7 which are identical to those of FIG. 1 are denoted by identical reference numerals. The polishing apparatus has a center robot 10 having arms 10-1 and 10-2 at a central part thereof Around the center robot 10 and in an area that can be accessed by the arm 10-1, there are provided a loading unit 11, an unloading unit 12, polishing units 13 and 14, a washing unit 15, and auxiliary spaces 18 and 19 for accommodating additional units, in a hexagonal arrangement.

In the auxiliary spaces 18 and 19 are installed, for example, thickness meters for measuring a thickness of the semiconductor wafer. In such case, the, e.g. dry, semiconductor wafer S is held by the arm 10-1 of the center robot 10 and fed to the thickness meter in the auxiliary space 18. Before a polishing operation the thickness of the semiconductor wafer S is measured by the thickness meter, and then the wafer S is transferred to the loading position 13-1 of the polishing unit 13.

After a polishing operation, the polished semiconductor wafer S is transferred to the washing unit 15 in the same manner as in the first embodiment and is washed and dried in the washing unit 15. After such washing operation, the clean and dry polished semiconductor wafer S is fed to the thickness meter in the auxiliary space 18 by the arm 10-1 of the center robot. After measuring the thickness of the semiconductor wafer S which has been polished, the clean and dry polished semiconductor wafer S is transferred to the unloading unit 12 by the arm 10-2 of the center robot 10.

Figure 8:
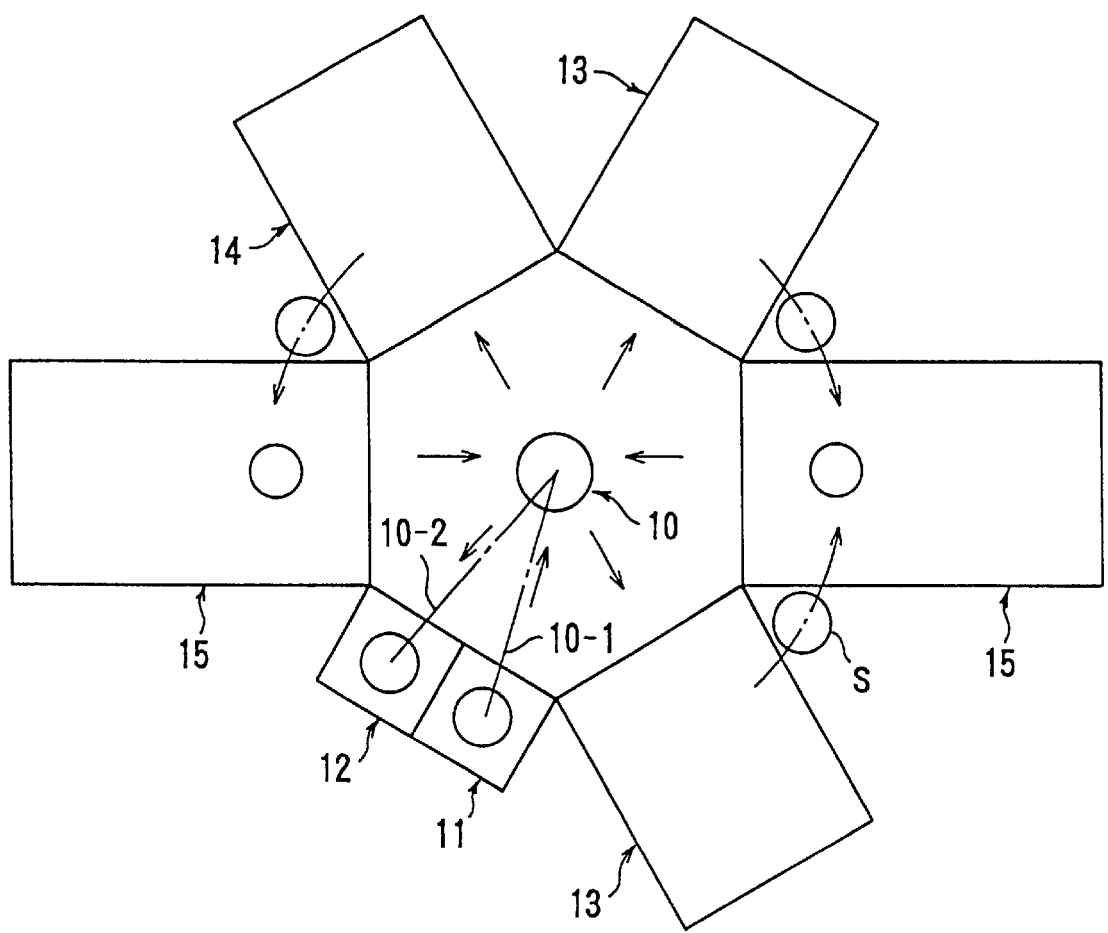
FIG. 8 is a schematic plan view of a third embodiment of a polishing apparatus according to the present invention.

FIG. 8 shows another embodiment of the polishing apparatus according to the present invention. The parts shown in FIG. 8 which are identical to those of FIG. 1 are denoted by identical reference numerals. Around a center robot 10 having arms 10-1 and 10-2 and in the area that can be accessed thereby there are provided, in a hexagonal arrangement, a loading unit 11, an unloading unit 12, a polishing system including two polishing units 13 and a polishing unit 14, a washing unit 15 provided between the polishing unit 14 and the unloading unit 12. This arrangement is preferable in the case where the polishing unit 13 requires twice as much time as the polishing unit 14 to polish a wafer.

In this case, the transfer of the semiconductor wafer S from the polishing units 13 to the washing unit 15 and the transfer of the semiconductor wafer S from the polishing unit 14 to the washing Unit 15 are performed, not by the center robot 10, but by another transfer means such as the polishing head supporting arms 13-3 and 14-3. However, the loading of the dry semiconductor wafer to the polishing units 13 and 14 and the removal of the clean and dry polished semiconductor wafer from the washing units 15 are performed by the arms 10-1 and 10-2, respectively, of the center robot 10. That is, the center robot 10 does not handle the semiconductor wafer polished by the polishing units 13 and 14 so that the arms 10-1 and 10-2 of the center robot 10 are not contaminated by the semiconductor wafer which has been polished and to which abrasive slurry adheres.

Figure 9:
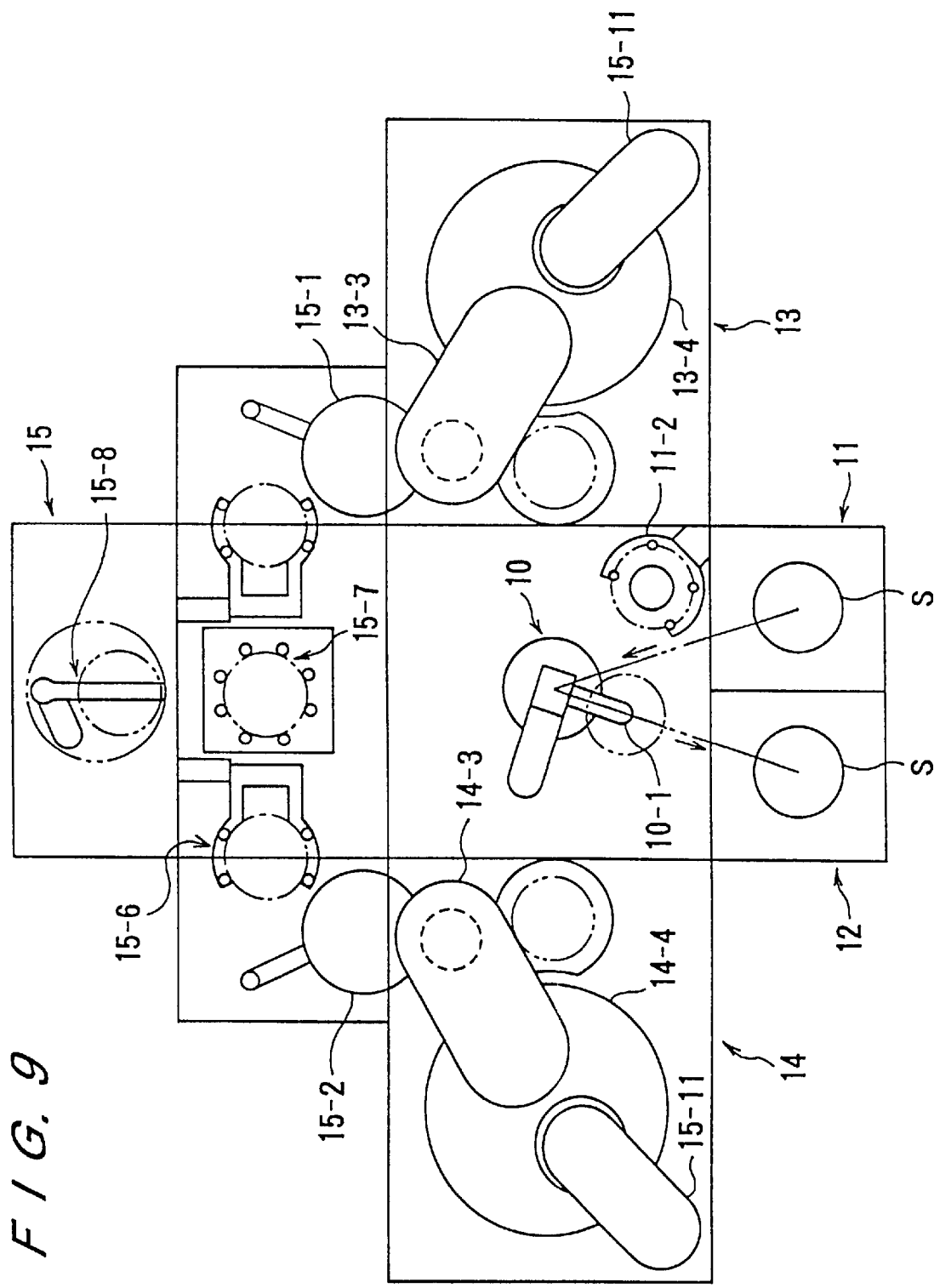
FIG. 9 is a schematic plan view of a fourth embodiment of a polishing apparatus according to the present invention.

FIG. 9 shows a still further embodiment of the polishing apparatus according to the present invention. The parts shown in FIG. 9 which are identical to those of FIG. 1 are denoted by identical reference numerals. The polishing apparatus is provided with a transfer structure including center robot 10 having only one arm 10-1. In the case of providing only the arm 10-1, the transfer structure also includes exclusive transferring devices provided between the polishing units 13 and 14, and between the polishing units 13. 14 and the washing unit 15. This system is applicable to a case where the degree of cleanliness of the dry semiconductor wafer which is transferred from the loading unit 11 is substantially the same as that of the clean and dry polished semiconductor wafer which is transferred to the unloading unit 12.

FIG. 10 shows a still a further embodiment of the polishing apparatus according to the present invention. The parts shown in FIG. 10 which are identical to those of FIG. 1 are denoted by identical reference numerals. Around a center robot 10 having arms and in the area that can be accessed by the arms, there are provided in a hexagonal arrangement a loading unit 11, a polishing system including four polishing units 13, 14, 21 and 22, and a washing unit 15. An unloading unit 12 is disposed at the end of the washing unit 15. Further, a storage unit 23 is disposed adjacent to the loading unit 11 and the unloading unit 12. An automatic guided vehicle 24 is employed to transfer a semiconductor wafer S which has been polished from the storage unit 23 and to convey a semiconductor wafer to be polished to the storage unit 23.

Loading of the semiconductor wafer S onto the polishing units 13, 14, 21 and 22 and the washing unit 15 and removal of the semiconductor wafer S from the loading unit 11 and the polishing units 13, 14, 21 and 22 are carried out entirely by the center robot 10. Further, the transfer of the semiconductor wafer from the washing unit 15 to the unloading unit 12 is carried out by the center robot 10. The center robot 10 of this embodiment forms the transfer structure including an arm for exclusively handling a clean semiconductor wafer (hereinafter referred as clean wafer handling arm) and an arm for exclusively handling a dirty semiconductor wafer (hereinafter referred as dirty wafer handling arm). The transfer of the, e.g. dry, semiconductor wafer from the loading unit 11 to one of the polishing units 13, 14, 21 and 22 and the transfer of the clean and dry polished semiconductor wafer from the washing unit 15 to the unloading unit 12 are carried out by the clean wafer handling arm, and the transfer of the semiconductor wafer between the polishing units 13, 14, 21 and 22 and the transfer of the polished semiconductor wafer from one of the polishing units 13, 14, 21 and 22 to the washing unit 15 are carried out by the dirty wafer handling arm. For example, in the case of using the center robot 10 of FIG. 1, the arm 10-1 serves as the clean wafer handling arm and the arm 10-2 serves as the dirty wafer handling arm. This structure prevents as much as possible the semiconductor wafer from being contaminated.

According to this embodiment, the polishing apparatus comprises a center robot 10 having arms 10-1 and 10-2 and constituting a universal transfer robot for transferring a semiconductor wafer S to the respective units, a plurality of units disposed around the center robot 10 and including a loading unit 11 for receiving thereon the semiconductor wafer S to be polished, e.g. a dry wafer, an unloading unit 12 for receiving thereon the clean and dry semiconductor wafer S which has been polished, a polishing system including polishing units 13, 14, 21 and 22 each for polishing the semiconductor wafer S and a washing unit 15 for washing and drying the semiconductor wafer S. The center robot 10 is provided with an arm exclusively for handling a clean semiconductor wafer and an arm exclusively for handling a dirty semiconductor wafer. The arm for exclusively handling a dirty semiconductor wafer is washed by a washing mechanism provided in the washing unit 15 after handling the dirty semiconductor wafer.

Figure 11:
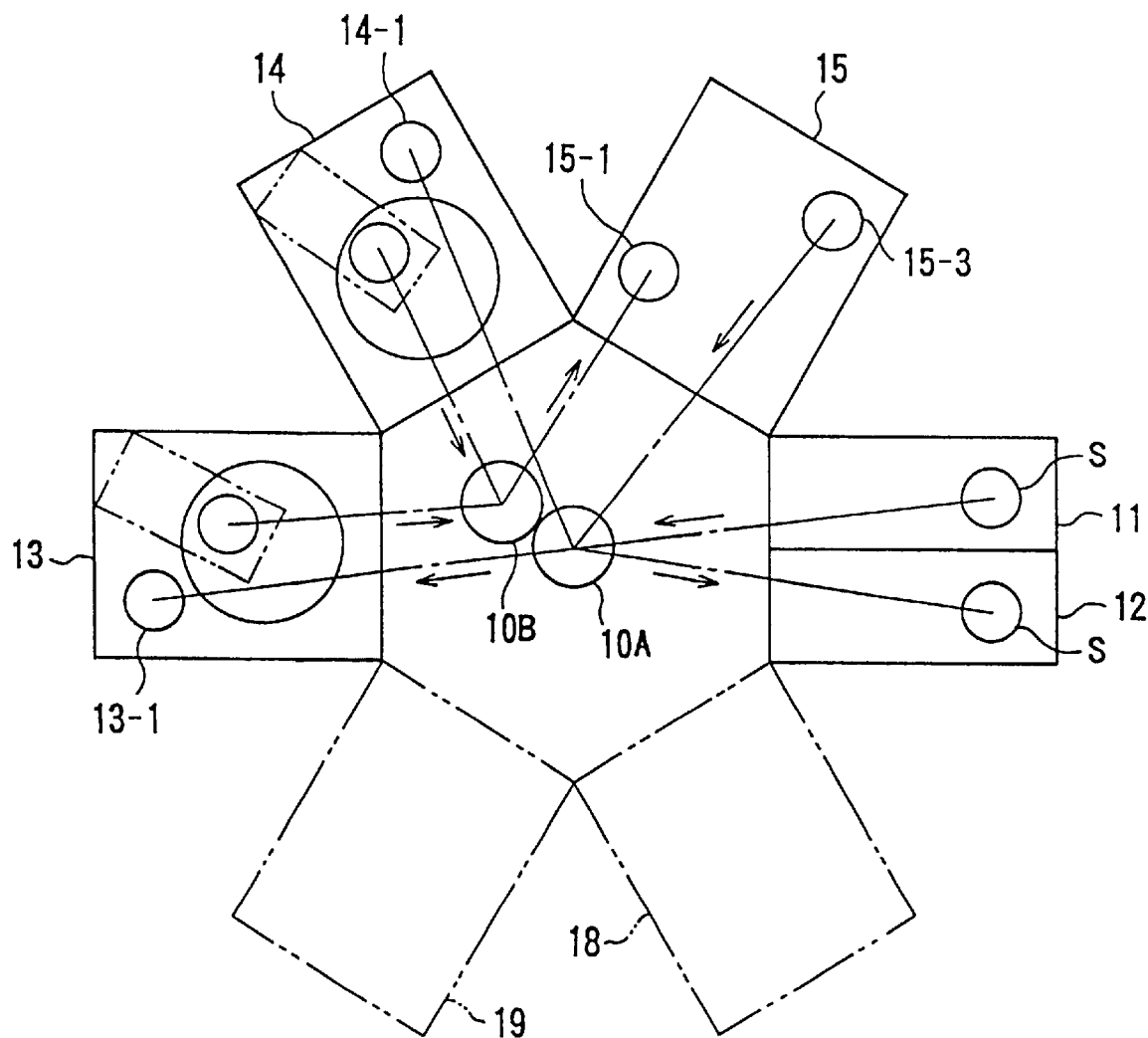
FIG. 11 is a schematic plan view of a sixth embodiment of a polishing apparatus according to the present invention.

FIG. 11 shows still another embodiment of the polishing apparatus according to the present invention. The parts shown in FIG. 11 which are identical to those of FIG. 1 are denoted by identical reference numerals. In this embodiment, the polishing apparatus comprises a transfer structure including a center robot 10A for exclusively handling a clean semiconductor wafer and a center robot 10B for exclusively handling a dirty semiconductor wafer. Further, the polishing apparatus comprises a polishing system including two polishing units 13, 14 and a washing unit 15.

With the above structure, a, e.g. dry, semiconductor wafer S is picked up from a loading unit 11 by the center robot 10A and transferred thereby to a loading position 13-1 of the polishing unit 13. After a polishing operation, the polished semiconductor wafer S is picked up from the polishing unit 13 by the center robot 10B and transferred thereby to a loading position 15-1 of the washing unit 15. After washing and drying operations by washing and drying systems, the resultant clean and dry polished semiconductor wafer S is picked Lip from a loading position 15-3 of the washing unit 15 by the center robot 10A and transferred thereby to an unloading unit 12. By the above manner, a polishing process and washing, and drying processes are carried out. A polishing operation is conducted by the polishing unit 14 in the same manner as described above.

According to this embodiment, the semiconductor wafers S are polished simultaneously or at a certain time lag by the polishing units 13 and 14, and each of the semiconductor wafers S polished by the polishing units 13 and 14 is washed and dried by washing and drying systems in the washing unit 15. That is, it is possible to deal with two semiconductor wafers with one washing unit for every two polishing units. Especially in the case where the cycle of the washing unit, i.e. the time interval between washing of a preceding semiconductor wafer and washing of a subsequent semiconductor wafer, is sufficiently shorter than the time required to polish semiconductor wafers, there is no downtime during the polishing operations. Thus, the processing speed of the overall apparatus is prevented from beings lowered and the total system can be more compact in size.

Further, the polishing units 13 and 14 can be set to polish semiconductor wafers under different conditions and selected in accordance with properties of the semiconductor wafers. Furthermore, a semiconductor wafer can be polished by the polishing unit 13, washed by the washing unit 15, and then polished by the polishing unit 14. Thereafter, the semiconductor wafer S can be washed and dried by the washing unit 15. That is, the semiconductor wafer can be polished twice. Such polishing apparatus has auxiliary spaces 18 and 19 as shown in FIG. 11.

According to this embodiment, the polishing apparatus comprises two center robots 10A, 10B each constituting a universal transfer robot for transferring a semiconductor wafer S to respective units, a plurality of units disposed around the center robots 10A and 10B and including a loading unit 11 for receiving thereon a semiconductor wafer S to be polished, e.g. a dry wafer, an unloading unit 12 for receiving thereon a clean and dry semiconductor wafer S which has been polished, polishing units 13 and 14 each for polishing a semiconductor wafer S and a washing unit 15 for washing and drying a semiconductor wafer S which has been polished. The center robot 10A handles only a clean semiconductor wafer, and the center robot 10B handles only a dirty semiconductor wafer. The center robot 10B is washed by a washing mechanism provided in the washing unit 15 after handling the dirty semiconductor wafer.

According to the above embodiments, since at least one polishing unit for performing chemical/mechanical polishing and at least one washing and drying unit are disposed around a center robot, the entire system is compact in size. Therefore, by providing an enclosing structure such as a housing unit (e.g. as shown at 30 in FIGS. 6, 6A) to cover the entire system and an exhaust duct, the polishing apparatus can be installed in a clean room without lowering the cleanliness thereof Further, the amount of space in the clean room required for installation of the polishing, apparatus can be reduced.

In the above embodiments, although the loading unit 11 and the unloading unit 12 are provided separately, the loading unit 11 and the unloading unit 12 may be formed integrally. For example, in the case where a semiconductor wafer is picked up from a basket containing semiconductor wafers and is put into the same basket after undergoing a polishing operation and washing and drying operations, the loading unit and the unloading unit are formed integrally.

The basket comprises a cassette which is placed on the loading unit and/or the unloading unit. A semiconductor wafer may be picked up from a cassette on the loading unit and the unloading unit and may be put into the same cassette on the loading unit and the unloading unit after undergoing a polishing operation and washing and drying operations. Further, a semiconductor wafer may be picked up from a cassette on the loading unit and may be put into a cassette on the unloading unit after undergoing a polishing operation and washing and drying operations.

The cassette which is placed on the loading unit and/or the unloading unit may be in accordance with the structures shown in the U.S. Pat. No. 5,679,059 and U.S. Pat. No. 5,827,110 disclosures of which hereby are incorporated herein by reference.

According to the present invention, a cluster type of polishing apparatus which integrates a plurality of units including a polishing unit defining, a polishing system and a washing and drying unit defining washing and drying systems and which employs a universal transfer robot can be constructed. The polishing apparatus performs a series of processes including a polishing operation and washing and drying operations while saving installation space and improving processing speed by efficiently combining a plurality of units including at least one polishing unit and at least one washing and drying unit. In the case where the time required for polishing is longer than the cycle time of the washing and drying, operations, the polishing system can include a plurality of polishing units to polish a plurality of semiconductor wafers and be associated washing and drying systems formed in one washing and drying unit. On the contrary, in the case where the cycle time of the washing and drying operations is longer than the time required for polishing, the washing and drying systems can be formed by a plurality of washing and drying units to wash and dry a plurality of semiconductor wafers and be associated with a polishing system in the form of one polishing unit. Further, according to the present invention, one or more polishing operations and one or more of each of washing and drying operations can be fully automated and can be changed or modified easily.

Furthermore, according to the present invention, since the transfer structure includes exclusive means for handling a clean semiconductor wafer and exclusive means for handling a dirty semiconductor wafer that are provided separately, contamination of subsequent semiconductor wafers or of respective units of the polishing apparatus caused by the dirty semiconductor wafer can be prevented.

Although the present invention has been described and illustrated with regard to specific features and embodiments thereof, it is to be understood that the present invention is not intended to be limited to such specifically described and illustrated features and embodiments. Rather, various modifications and changes to such specifically described and illustrated features and embodiments as would be apparent to one of ordinary skill in the art are contemplated as being within the scope of the present invention.

What is claimed is:

1. An apparatus for polishing and then washing a semiconductor wafer, said apparatus comprising:
    an enclosing structure capable of containing and preventing an atmosphere within said enclosing structure from escaping therefrom to exterior thereof;
    a polishing system within said enclosing structure for polishing the semiconductor wafer to form a polished semiconductor wafer;
    a washing system within said enclosing structure for washing the polished semiconductor wafer to form a clean polished semiconductor wafer;
    a drying system within said enclosing structure for drying the clean polished semiconductor wafer to form a clean and dry polished semiconductor wafer; and
    a first robot in said enclosing structure for transferring a wet polished semiconductor wafer, and a second robot in said enclosing structure for transferring a dry semiconductor wafer.

2. An apparatus as claimed in claim 1, wherein said washing system includes plural washing stations operable to achieve plural washing operations.

3. An apparatus as claimed in claim 2, wherein said washing system includes a transfer robot for transferring said polished semiconductor wafer from a preceding washing station to a subsequent washing station in said washing stations.

4. An apparatus as claimed in claim 1, further comprising a rinsing device for rinsing the polished semiconductor wafer at a first position that is upstream of and separate from a second position at which is located a primary washing station.

5. An apparatus as claimed in claim 1, wherein said drying system comprises a spin-dryer.

6. An apparatus as claimed in claim 1, wherein said enclosing structure is a housing.

7. A method for polishing and then washing a semiconductor wafer, said method comprising:
    removing said semiconductor wafer from a container, configured to hold a plurality of wafers
    chemical mechanical polishing said semiconductor wafer to form a polished semiconductor wafer;
    washing said polished semiconductor wafer to form a clean polished semiconductor wafer;
    spin-drying the clean polished semiconductor wafer to form a clean and dry polished semiconductor wafer; and
    returning said clean and dry polished semiconductor wafer to said container.

8. A method as claimed in claim 7, wherein said polishing comprises conducting plural polishing operations by plural turntables.

9. A method as claimed in claim 8, wherein said plural polishing operations comprise plural sequential polishing operations conducted on said semiconductor wafer by said plural turntables.

10. A method as claimed in claim 7, wherein said washing comprises conducting plural washing operations.

11. A method as claimed in claim 7, comprising transferring said clean and dry polished semiconductor wafer with at least one first mechanism that is discrete from at least one second mechanism employed to transfer said polished semiconductor wafer.

12. A method as claimed in claim 11, wherein said at least one first mechanism comprises a first robot and said at least one second mechanism comprises a second robot.

13. An apparatus for polishing and then washing a semiconductor wafer, said apparatus comprising:
    an enclosing structure capable of containing and preventing an atmosphere within said enclosing structure from escaping therefrom to exterior thereof;
    a loading unit for receipt of a semiconductor wafer to be polished;

a polishing system within said enclosing structure for polishing the semiconductor wafer to form a polished semiconductor wafer, said polishing system including a turntable, a top ring for holding the semiconductor wafer and pressing the semiconductor wafer against said turntable to polish the semiconductor wafer, and means for transferring the semiconductor wafer to a loading position for loading the semiconductor wafer to be polished to said top ring;

a washing system within said enclosing structure for washing the polished semiconductor wafer to form a clean polished semiconductor wafer;

a drying system within said enclosing structure for drying the clean polished semiconductor wafer to form a clean and dry polished semiconductor wafer; and an unloading unit for receiving the clean and dry polished semiconductor wafer.

14. An apparatus as claimed in claim 13, wherein said loading unit and said unloading unit are separate.

15. An apparatus as claimed in claim 13, wherein said loading unit and said unloading unit are integrated into a single unit.

16. An apparatus as claimed in claim 13, wherein said washing system includes plural washing stations operable to achieve plural washing operations.

17. An apparatus as claimed in claim 16, wherein said plural washing operations include a primary washing operation and a secondary washing operation.

18. An apparatus as claimed in claim 13, further comprising a rinsing device for rinsing the polished semiconductor wafer at a first position that is upstream of and separate from a second position at which is located a primary washing station.

19. An apparatus as claimed in claim 13, further comprising at least one robot for transferring the semiconductor wafer after said loading unit receives the semiconductor wafer and before said unloading unit receives the clean and dry polished semiconductor wafer.

20. An apparatus as claimed in claim 19, wherein said clean and dry polished semiconductor wafer is transferred with at least one first mechanism that is discrete from at least one second mechanism employed to transfer said polished semiconductor wafer.

21. An apparatus as claimed in claim 20, wherein said at least one robot comprises a first robot comprising said at least one first mechanism and a second robot comprising said at least one second mechanism.

22. An apparatus as claimed in claim 13, wherein said drying system comprises a spin-dryer.

23. An apparatus as claimed in claim 13, wherein said enclosing structure is a housing.

24. A-method for polishing and then washing a semiconductor wafer, said method comprising:

introducing the semiconductor wafer from the interior of a clean room into an enclosing structure installed in said clean room;

transferring said semiconductor wafer to a loading position;

loading said semiconductor wafer from said loading position to a top ring;

polishing said semiconductor wafer by pressing said semiconductor wafer against a turntable with said top ring to form a polished semiconductor wafer;

washing said polished semiconductor wafer to form a clean polished semiconductor wafer;

drying said clean polished semiconductor wafer to form a clean and dry polished semiconductor wafer;

removing said clean and dry polished semiconductor wafer from said enclosing structure to said interior of said clean room; and transferring the semiconductor wafer by at least one robot after said introducing and before said removing.

25. A method as claimed in claim 24, wherein said polishing comprises conducting plural polishing operations by plural polishing tables.

26. A method as claimed in claim 25, wherein said plural polishing operations comprise plural sequential polishing operations conducted on said semiconductor wafer by said plural polishing tables.

27. A method as claimed in claim 24, wherein said washing comprises conducting plural washing operations.

28. A method as claimed in claim 27, wherein said plural washing operations include a primary washing operation and a secondary washing operation.

29. A method as claimed in claim 24, further comprising rinsing said polished semiconductor wafer before said washing.

30. A method as claimed in claim 29, comprising conducting said rinsing at a first position and then conducting said washing at a second position different from said first position.

31. A method as claimed in claim 24, comprising transferring said clean and dry polished semiconductor wafer with at least one first mechanism that is discrete from at least one second mechanism employed to transfer said polished semiconductor wafer.

32. A method as claimed in claim 31, wherein said at least one robot comprises a first robot comprising said at least one first mechanism and a second robot comprising said at least one second mechanism.

33. A method as claimed in claim 24, wherein said drying comprises spin-drying said clean polished semiconductor wafer.

34. An apparatus for polishing and then washing a semiconductor wafer, said apparatus comprising:

an enclosing structure capable of containing and preventing an atmosphere within said enclosing structure from escaping therefrom to exterior thereof;

at least three turntables within said enclosing structure;

a plurality of top rings for holding semiconductor wafers and pressing the semiconductor wafers against said turntables to thereby polish the semiconductor wafers; and a washing system within said enclosing structure for washing the polished semiconductor wafer to form a clean polished semiconductor wafer;

a drying system within said enclosing structure for drying the clean polished semiconductor wafer to form a clean and dry polished semiconductor wafer; and at least one robot for transferring the semiconductor wafer within said enclosing structure.

35. An apparatus as claimed in claim 34, wherein said washing system includes plural washing stations operable to achieve plural washing operations.

36. An apparatus as claimed in claim 35, wherein said washing system includes a transfer robot for transferring said polished semiconductor wafer from a preceding washing station to a subsequent washing station in said washing stations.

37. An apparatus as claimed in claim 34, further comprising, a rinsing device for rinsing the polished semiconductor wafer at a first position that is upstream of and separate from a second position at which is located a primary washing station.

38. An apparatus as claimed in claim 34, wherein said drying system comprises a spin-dryer.

39. An apparatus as claimed in claim 34, wherein said enclosing structure is a housing.

40. An apparatus for polishing and then washing a semiconductor wafer, said apparatus comprising:

an enclosing structure capable of containing and preventing an atmosphere within said enclosing structure from escaping therefrom to exterior thereof;

a polishing system within said enclosing structure for polishing the semiconductor wafer to form a polished semiconductor wafer, said polishing system including an abrasive cloth that is used for polishing;

a washing system within said enclosing structure for washing the polished semiconductor wafer to form a clean polished semiconductor wafer;

a drying system within said enclosing structure for drying the clean polished semiconductor wafer to form a clean and dry polished semiconductor wafer; and dressing mechanism for dressing said abrasive cloth, said dressing mechanism comprising a dressing tool that is removably provided in said dressing mechanism so that said dressing tool is attached when dressing is performed.

41. A method according to claim 7, wherein said container comprises a cassette.

* * * * *